(12) United States Patent
Fjelstad (10) Patent No.: US 6,266,872 B1
(45) Date of Patent: Jul. 31, 2001

(54) METHOD FOR MAKING A CONNECTION COMPONENT FOR A SEMICONDUCTOR CHIP PACKAGE

(75) Inventor: Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 08/987,283

(22) Filed: Dec. 9, 1997

Related U.S. Application Data (60) Provisional application No. 60/033,067, filed on Dec. 12, 1996.

(51) Int. Cl.[7] .................................................. H05K 3/30
(52) U.S. Cl. .............................. 29/832; 29/840; 29/841; 29/830; 438/118; 439/66
(58) Field of Search ..................... 29/832, 840, 830, 29/841; 439/66, 91, 77; 228/180.22; 438/118; 174/261, 250, 260; 361/767, 770, 760

(56) References Cited

U.S. PATENT DOCUMENTS

| | | | |
|---|---|---|---|
| 4,030,004 | * 6/1977 | Rutt | ........................ 361/313 |
| 5,112,418 | * 5/1992 | Pike | ........................ 156/319 |
| 5,148,266 | 9/1992 | Khandros et al. . | |
| 5,158,645 | * 10/1992 | Covert et al. | ........................ 156/645 |
| 5,208,729 | * 5/1993 | Cipolla et al. | ........................ 361/382 |
| 5,390,844 | 2/1995 | Distefano et al. . | |
| 5,398,863 | 3/1995 | Grube et al. . | |
| 5,455,390 | * 10/1995 | Distefano et al. | ........................ 174/262 |
| 5,491,302 | 2/1996 | Distefano et al. . | |
| 5,518,964 | * 5/1996 | Distefano et al. | ........................ 437/209 |
| 5,536,909 | 7/1996 | DiStefano et al. . | |
| 5,659,952 | 8/1997 | Kovac et al. . | |
| 5,779,833 | * 7/1998 | Cawley et al. | ........................ 156/89.11 |
| 5,794,330 | * 8/1998 | Distefano et al. | ........................ 29/840 |
| 5,798,469 | * 8/1998 | Nufer | ........................ 75/246 |
| 5,801,441 | * 9/1998 | Distefano et al. | ........................ 257/696 |
| 5,808,874 | * 9/1998 | Smith | ........................ 361/769 |
| 5,915,170 | * 6/1999 | Raab et al. | ........................ 438/118 |

* cited by examiner

Primary Examiner—Carl J. Arbes
Assistant Examiner—Minh Trinh
(74) Attorney, Agent, or Firm—Lerner, David, Littenberg, Krumholz & Mentlik, LLP (57) ABSTRACT

A method of making a microelectronic assembly includes providing a connection component including a dielectric element with electrically conductive parts, providing a fugitive material in contact with the dielectric element and providing a curable material on the dielectric element after providing the fugitive material and curing the curable material to provide a compliant element so that the fugitive material isolates the electrically conductive parts from the compliant element. The method also includes storing the connection component with the fugitive material and the compliant element. After the storing step, the fugitive material is removed from the connection component and the electrically conductive parts are then connected to a microelectronic element. The step of removing the fugitive material is generally performed less than 24 hours before the electrically conductive parts are connected together and preferably less than one hour before the parts are connected together. The fugitive material may include a liquid soluble material removable by chemical treatment, or a material which may be removed upon exposure to heat, radiation or ultraviolet light.

28 Claims, 5 Drawing Sheets

METHOD FOR MAKING A CONNECTION COMPONENT FOR A SEMICONDUCTOR CHIP PACKAGE

CROSS REFERENCE TO RELATED APPLICATIONS

This application claims benefit of U.S. Provisional Patent Application Serial No. 60/033,067 filed Dec. 12, 1996, the disclosure of which is incorporated by reference herein.

FIELD OF THE INVENTION

The present invention generally relates to microelectronic assemblies, and more specifically it relates to connection components which facilitate electrical interconnections between a microelectronic element, such as a semiconductor chip, and an external circuit element, such as a printed circuit board.

BACKGROUND OF THE INVENTION

Connection components, such as interposers and substrates, are typically used in combination with microelectronic elements, such as semiconductor chips, to facilitate electrical interconnections between semiconductor chips and external circuit elements. The reliability of the entire circuit operation depends upon the electrical connections between the chip, the interposer and the external circuit elements. To enhance reliability, a compliant layer is frequently used between the interposer and the semiconductor chip in order to permit movement of terminals on the interposer with respect to electrical contacts on the semiconductor chip during testing, assembly and thermal cycling.

Such a compliant layer is shown, for example, in U.S. Pat. No. 5,148,266, the disclosure of which is incorporated herein by reference. According to certain embodiments shown in the '266 patent, a semiconductor chip having a front face including a plurality of peripheral contacts is connected to an external circuit board through a flexible, dielectric interposer. The interposer has terminals and includes flexible leads for interconnecting the contacts on the chip with the terminals on the interposer so that the terminals are movable relative to the contacts on the chip which provides excellent resistance to thermal cycling differences between the chip and the external circuit board. The flexible interposer may be supported by a compliant layer which allows the terminals to move relative to the contacts on the chip.

Copending, commonly assigned U.S. patent application Ser. No. 08/365,699 entitled "Compliant Interface for a Semiconductor Chip and Method Therefor" filed Dec. 29, 1994, the disclosure of which is incorporated herein by reference, discloses a method of fabricating a compliant interface for a semiconductor chip typically comprised of a compliant layer having a controlled thickness. In certain preferred methods according to the '699 application, a first support structure, such as a flexible, substantially inextensible dielectric film having electrically conductive parts, is assembled with a second support structure, such as a semiconductor chip having a plurality of contacts on a contact bearing face. A resilient element, such as a plurality of compliant pads which define channels therebetween, are disposed between the dielectric film and the contact bearing face of the semiconductor chip. After the dielectric film and the semiconductor chip have been assembled, the electrically conductive parts of the dielectric film are bonded to the contacts on the semiconductor chip. A compliant filler, such as a curable liquid, is then injected into the channels between the chip and the dielectric film and around the compliant pads while the chip and dielectric film are held in place. The filler may then be cured to form a substantially uniform, planar, compliant layer between the chip and the dielectric film.

In some cases, a connection component can be prefabricated. The prefabricated component can be stored for later assembly and bonding to a semiconductor chip, and can also be shipped from the component manufacturer to a chip subassembly plant where the component is united with the semiconductor chip. In such prefabricated components, the compliant layer may often be coated on its exposed surface with adhesive, and a peelable release layer may be applied over the adhesive to protect and preserve it. Copending commonly assigned U.S. patent application Ser. No. 08/872,379, filed Jun. 10, 1997, the disclosure of which is incorporated by reference herein, discloses a method of fabricating a compliant interface for a semiconductor chip comprising a resilient element having one or more intermediary layers capable of being wetted by an adhesive. In one preferred embodiment according to the disclosure, a layer of fibrous material, such as paper, is provided at one or more surface regions of the curable elastomer and the elastomer is then cured while in contact with the paper. The resilient element provided by the disclosed methods can be removed from storage and used with an adhesive to bond the resilient element to one or more microelectronic elements.

Problems may arise when compliant layers are applied to connection components which are then stored for a prolonged period of time prior to being assembled to another microelectronic element, such as a semiconductor chip. These difficulties may result from the presence of low molecular weight substances in the compliant layer which can exude from the compliant layer and contaminate the electrical parts. For example, where a resilient element incorporating silicone compounds is present on a connection component for many months, the silicone may contaminate the leads of the connection component which could ultimately impede the formation of strong bonds between the leads and the contacts on the chip.

Solutions to this problem are disclosed in commonly assigned U.S. patent application Ser. No. 08/879,922, filed Jun. 20, 1997, the disclosure of which is incorporated by reference herein. In certain preferred embodiments, the '922 application discloses a transferable resilient element or compliant layer which is stored separate and apart from a connection component and a semiconductor chip until immediately prior to assembly of the component and the chip. The compliant layer is preferably stored between one or more storage liners and has one or more tacky surface regions so that the compliant layer can be easily assembled between and adhered to opposing faces of a connection component and a semiconductor chip at the desired time. By keeping the compliant layer separate and apart from the connection component and the semiconductor chip until immediately prior to assembly of the semiconductor package, contamination of the electrically conductive parts is avoided.

Despite the positive results of the aforementioned commonly owned inventions, the disclosures of which are incorporated herein by reference, still further improvements and alternatives would be desirable.

SUMMARY OF THE INVENTION

One aspect of the present invention provides a method of manufacturing a microelectronic assembly. A method in accordance with this aspect of the invention includes providing a connection component having a dielectric element with electrically conductive parts; providing a fugitive material in contact with the dielectric element and providing a curable material on the dielectric element after providing the fugitive material and curing the curable material to provide a compliant element, wherein the fugitive material isolates the electrically conductive parts from the compliant element. The method also includes storing the connection component with the fugitive material and the compliant element; after the storing step, removing the fugitive material from the connection component; and after the removing step, connecting the electrically conductive parts to a microelectronic element such as a semiconductor chip. The step of removing the fugitive material may further include the step of chemically treating the fugitive material. The removing step is preferably performed just shortly before the step of connecting the electrically conductive parts to one another, typically less than 24 hours before the connecting step and most preferably less than one hour before the connecting step.

As used herein, the term "fugitive material" means a material which can be removed by application of heat, radiation, ultraviolet light or chemical treatment without destruction of the dielectric element, the electrically conductive parts or the compliant element. Typically, the fugitive material includes a water soluble material, and may include a water soluble adhesive. In such instances, the removing step includes the step of chemically treating the fugitive material with a liquid solution such as water. Fugitive materials other than the water soluble materials discussed above may be employed, provided that such materials do not attack the flexible dielectric element, the compliant layer or the electrically conductive parts. For example, fugitive material such as a relatively low melting thermoplastic or a material which will evaporate at a relatively low temperature may be employed. These materials may be removed by such steps as heating the fugitive material or exposing the fugitive material to heat and/or ultraviolet light.

The method may also include the step of providing an adhesive, such as a thermoplastic film or a curable elastomer material, over the compliant element before the storage step whereby the adhesive is on top of the compliant element and remote from the dielectric element. Preferably the adhesive is provided as small swatches of thermoplastic or B staged adhesive film which are attached to the curable material before it is cured. A storage liner may be provided over the adhesive to protect the adhesive from contamination and make it easier to handle the connection component during storage. In other embodiments the adhesive may be provided over the compliant element immediately before the connecting step.

The compliant element may include an array of compliant pads defining channels therein, similar to that disclosed in the '699 application. After the connection component, including the plurality of compliant pads, has been assembled with the microelectronic element, such as a semiconductor chip, and after the electrically conductive parts of the connection component have been connected to the electrical contacts on the chip, a curable liquid, such as a silicone elastomer, may be allowed to flow within the channels and around the electrically conductive parts. The curable liquid may then be subjected to a curing process so that the array of adhesive pads and the curable liquid form a homogenous compliant layer between the connection component and the semiconductor chip.

The compliant element and the fugitive material are provided on the dielectric element by first providing the fugitive material in contact with the dielectric element. In one preferred embodiment, the fugitive material is provided in contact with the dielectric element by providing a stencil having a first surface and a second surface and having one or more apertures extending therethrough, printing or depositing the fugitive material on the second surface of the stencil, around the one or more apertures in the stencil, abutting the second surface of the stencil against the dielectric element so that the fugitive material is in contact with the dielectric element and curing the fugitive material. Next, a curable material, which is later cured to form the compliant element, is provided in contact with the dielectric element by providing the curable material on the first surface of the stencil and stenciling the curable material into the one or more apertures in the stencil and curing the curable material. The curable material may also include an adhesive. The stencil remains on the dielectric element during the curing the curable material step. An adhesive, such as a partially cured curable elastomer material, may then be provided in contact with the curable material and remote from the dielectric element. The adhesive may be placed in contact with the curable material by providing a spacer plate having one or more apertures therein over the first surface of the stencil whereby the one or more apertures in the spacer plate are in substantial alignment with the curable material. The adhesive may then be printed or deposited over the spacer plate to provide the adhesive in the one or more apertures therein before the curing the curable material step. In other embodiments the adhesive may be stored separately from the connection component during the storing step and provided over the compliant element immediately before the connecting step. In further embodiments, the adhesive is maintained in a partially cured state while the connection component is in storage so that the adhesive will readily bond to another microelectronic element when the connection component is removed from storage and prepared for assembly.

A storage liner, such as a flexible paper, Teflon® sheet or plastic sheet, may be provided over the adhesive to prevent contamination of the adhesive and/or the connection component. In embodiments which do not incorporate an adhesive, the storage liner may be provided directly over the compliant element in order to avoid, inter alia, contamination of the compliant element. In these embodiments, the storage liner may be provided over the curable material either before or after curing the curable material step. The storage liner may include a release film present at one or more surfaces of the liner so that the storage liner may be readily removed from the connection component without pulling the compliant element and/or fugitive material from the connection component. The spacer pad and stencil may be removed prior to storage, or may be left in place during storage.

Before the connection component is assembled with a semiconductor chip, the storage liner, spacer plate and stencil are removed. Then, shortly before the connection component is assembled with the chip, the fugitive material is removed. As mentioned previously, the particular process used to remove the fugitive material depends on the specific composition of the fugitive material. In various embodiments the fugitive material may be removed (i.e., dissolved) by chemically treating the fugitive material. In other embodiments, the fugitive material may be removed by exposing the fugitive material to radiant energy, ultraviolet energy or heat. After the fugitive material has been removed, the electrically conductive parts are no longer encapsulated or covered by the fugitive material so that the electrically conductive parts are "free," i.e., capable of being moved into engagement with and bonded to contacts on a semiconductor chip. The connection component is then juxtaposed with and assembled to the semiconductor chip by abutting the contact bearing face of the semiconductor chip against the compliant element. The chip and the connection component are then electrically interconnected by bonding the electrically conductive parts of the connection component to the contacts on the semiconductor chip. The semiconductor chip package may then be encapsulated with a curable material, such as a liquid silicone elastomer, which is allowed to flow between the chip and the connection component, within the channels in the compliant element and around the electrically conductive parts. The stencil and the spacer plate may be reclaimed and reused by the manufacturer of the connection component.

The present invention incorporates the realization that the manner in which a compliant element is provided on a connection component can adversely affect the ability of a connection component to be electrically bonded to another microelectronic element. Thus, where a compliant element is applied to a connection component, such as a dielectric element having electrically conductive parts, and the dielectric element is stored for a prolonged period of time with the compliant element in contact with the electrically conductive parts, and then assembled to another microelectronic element having electrical contacts, difficulties can arise in bonding the electrically conductive parts and the electrical contacts to one another. It is generally believed that these difficulties result from the presence of low-molecular-weight substances in the compliant element which exude from the compliant element and contaminate the electrically conductive parts. For example, where a compliant element incorporating silicone compounds is present on a dielectric element for many months, the silicone may spread or "creep" across the dielectric element and contaminate conductive leads on the dielectric element. The presence of silicone on the leads will impede or retard ultrasonic or thermosonic bonding of the leads to contacts on a semiconductor chip, and will require extra care in the bonding operation to assure satisfactory quality. To avoid these problems, the present invention provides a fugitive material on the connection component which physically isolates the electrically conductive parts from the compliant element. By isolating the electrically conductive parts from the compliant element, contamination of the electrically conductive parts during storage is substantially eliminated. This facilitates formation of a satisfactory bond between the electrically conductive parts and the contacts on a semiconductor chip. In order to minimize the likelihood of contamination, the fugitive material is generally not removed until less than 24 hours before the bonding step and most preferably less than one hour before the bonding step.

A further embodiment follows somewhat the teachings of the embodiments described above; however, in this particular embodiment, the fugitive material, such as a liquid soluble material, is provided in the shape of a stencil having a first and second surface including one or more apertures extending therethrough. In this embodiment, the stencil is pre-punched to form the one or more apertures and is pre-screened with a water soluble adhesive at the second surface thereof. The second surface of the stencil is then assembled to the dielectric element. Next, a curable material, such as a curable silicone elastomer, is provided on the dielectric element by providing the curable material in the one or more apertures in the fugitive material and curing the curable material while the fugitive material (in the form of a stencil) remains on the dielectric element. A layer or sheet of thermoplastic or a B-staged adhesive may be rolled onto the exposed surface of the curable elastomer (i.e. the surface remote from the dielectric element) and the first surface of the stencil. A roller may be used to compress the adhesive in order to eliminate air or voids between the adhesive and the curable elastomer and stencil. A flat plate may then be placed over the adhesive and pressed toward the dielectric element so that the adhesive and the curable material are compressed together while being cured. After the curable material has been cured to provide a compliant element, a laser or a mechanical cutting system may then be employed to make a controlled depth cut through the adhesive film and into the stencil, outside the perimeter of the compliant layer. In this condition, the stencil isolates the electrically conductive parts on the dielectric element from the curable elastomer material. Finally, shortly before the connection component is juxtaposed with and assembled to a semiconductor chip, the stencil is removed according to the methods described, e.g. chemical treatment, exposure to ultraviolet light and/or heat.

Yet another embodiment of the present invention provides a connection component for a microelectronic assembly including a flexible dielectric sheet having a first surface, a second surface and electrically conductive parts having conductive terminals on the second surface and one or more flexible leads integrally connected to the conductive terminals. The connection component also includes a compliant element, such as a curable elastomer including silicone, and a fugitive material on the dielectric structure. The compliant element may include a plurality of pads. The fugitive material is soluble in at least one solvent which does not negatively effect the dielectric structure or the electrically conductive parts. The fugitive material isolates and protects the electrically conductive parts from the compliant element so that the compliant element may not diff-use or spread onto the electrically conductive parts which could adversely effect the bonds between the electrically conductive parts and the electrical contacts on another microelectronic element. In certain preferred embodiments, the fugitive material is in contact with the second surface of the dielectric element and the flexible leads thereon. In other embodiments, the fugitive material is in contact with the first surface of the dielectric element and remote from the flexible leads; however, the placement of the fugitive material in relation to the compliant element isolates the leads from the compliant element. The connection component also includes a stencil having one or more apertures therein on the fugitive material, whereby the compliant element is disposed in the one or more apertures. The component may further also include an adhesive in contact with the compliant pads and remote from the dielectric element, such as a thermoplastic film which is either partially or fully cured or a polyimide siloxane film. The connection component may further include a spacer plate having one or more apertures therein which is positioned over the stencil. The apertures in the spacer plate are in substantial alignment with the apertures in the stencil and the adhesive is disposed in the apertures in the spacer place so that the one or more adhesive pads are in alignment with the one or more compliant pads. The connection component may also include a storage liner overlying the adhesive for protecting the adhesive from contamination. The storage liner may include a release film at one or more surfaces thereof so that the release liner may be readily removed from the connection component when it is desirable to assemble the connection component to a semiconductor chip.

In yet another embodiment, a connection component for a microelectronic assembly substantially similar to that disclosed above is provided; however, the fugitive material is provided in the form of a stencil having a plurality of apertures extending therethrough and the compliant element is disposed in the plurality of apertures in the fugitive material. The stencil isolates the electrically conductive parts of the dielectric element from the compliant element. In this particular embodiment an adhesive film or adhesive layer, such as a polyimide siloxane film, is provided over the compliant element and remote from the dielectric element. The connection component further includes a storage liner overlying the adhesive so that the adhesive is disposed between the storage liner and the compliant element.

The forgoing and other objects and advantages of the present invention will be better understood from the following detailed description of preferred embodiments taken together with the attached drawings.

DETAILED DESCRIPTION OF PREFERRED EMBODIMENTS

Figure 1A:
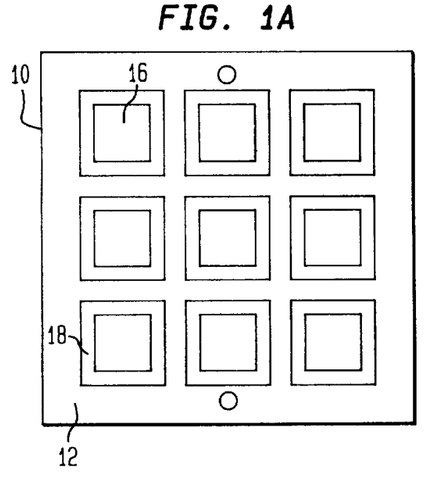
FIG. 1A shows a top view of a stencil used in a first stage of a method of assembling a connection component for a semiconductor chip package in accordance with one embodiment of the present invention.
Figure 1B:
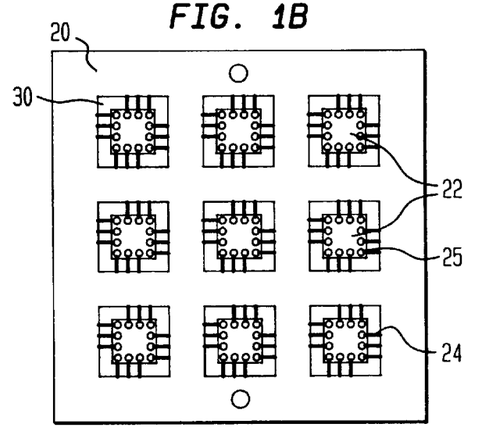
FIGS. 1B–1G show the embodiment of FIG. 1A during further stages of assembly.
Figure 1C:
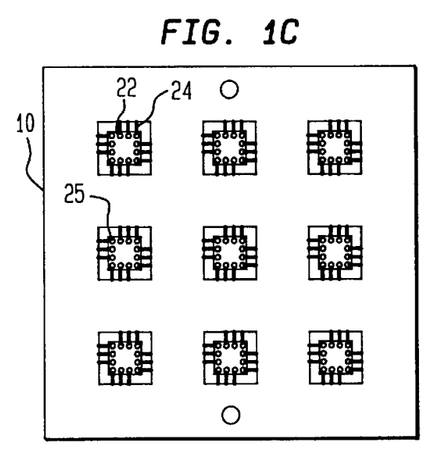
Figure 1D:
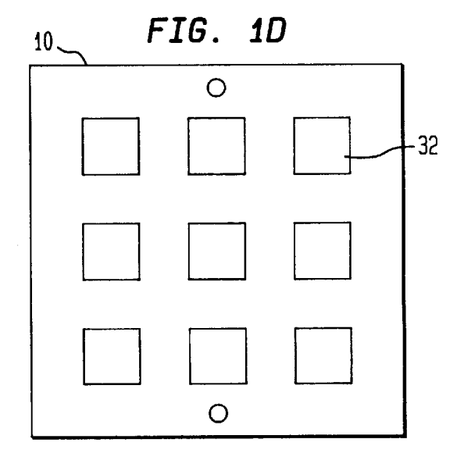
Figure 1E:
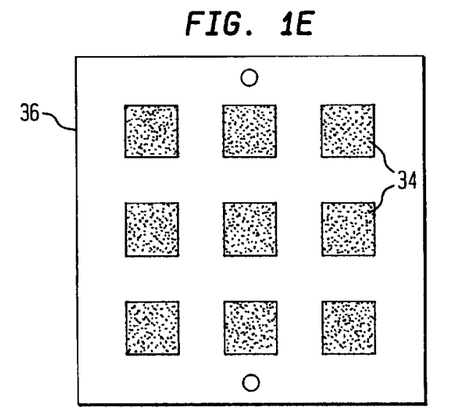
Figure 1F:
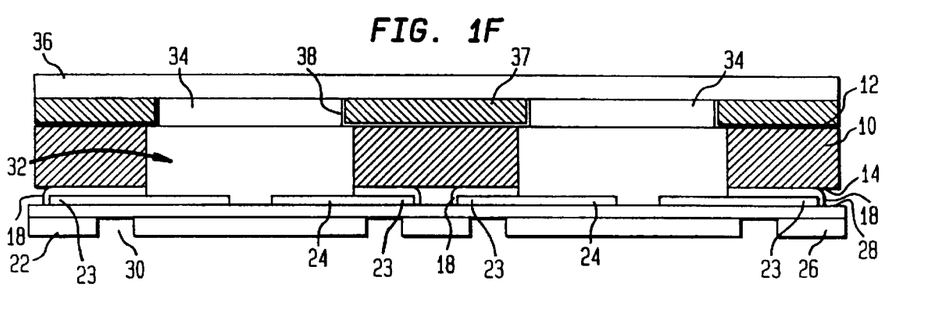

One embodiment of the present invention provides a method of making a microelectronic assembly and is generally shown in FIGS. 1A–1G. Referring to FIG. 1A, a stainless steel stencil 10 having a first surface 12 and a second surface 14 and one or more apertures 16 extending therethrough is provided. A fugitive material 18, such as a water soluble material, is printed or deposited on the second surface 14, around the apertures 16 in the stencil 10. FIG. 1B shows a polyimide tape 20 including a plurality of flexible dielectric elements 22 bearing leads 24 and conductive terminals 25 in a plurality of individual regions. Leads 24 have first ends 23, as shown in FIG. 1F. Each flexible dielectric element 22 includes a flexible sheet-like dielectric film having a first surface 26 and a second surface 28. The dielectric film 22 is preferably formed from a polymeric material, such as KAPTON® (E) available from DuPont Chemical Corporation, having an approximate thickness between 25 microns and 75 microns. The dielectric film 22 has conductive terminals 25 on the second surface 28 thereof, electrically conductive parts or flexible leads 24 extending from the terminals for electrically connecting the terminals to another microelectronic element, and bond windows 30 for accessing the leads 24 while bonding the leads 24 with the other microelectronic element. Referring to FIG. 1C, the stencil 10 is then placed over the plurality of dielectric film 22 so that the apertures 16 in the stencil 10 are aligned with the respective dielectric film 22. The second surface 14 of the stencil 10 is abutted against the second surface 28 of the dielectric film 22 so that the fugitive material 18 contacts the second surface 28 of the dielectric film 22. The fugitive material 18 serves to, inter alia, protect the flexible leads from contamination and adhere the stencil 10 to the dielectric film 22 during the assembly process. Referring to FIG. 1D, a curable material 32, such as a curable silicone elastomer, is provided on the first surface 12 of the stencil 10 and printed or deposited into the apertures 16 in the stencil 10. The curable material 32 typically comprises a curable liquid elastomer material, such as a silicone elastomer. Material currently being used as a silicone elastomer are DC 577, DC 6810 and DC 6811 manufactured by Dow Corning. The curable material 32 may also include an adhesive. The curable silicone elastomer is later cured while the stencil remains in place on the dielectric film 22 to provide a compliant element 32 on the dielectric film 22.

The stencil 10 is pre-treated so as to prevent the stencil 10 from bonding to the compliant element 32. For example, in one embodiment, the stencil 10 is pre-treated with a release treatment which is soluble in water-based solutions. In another embodiment, the stencil 10 may be surface treated such that it has a Teflon® coating. During application of the curable material 32, the fugitive material 18 acts as a barrier between the apertures 16 in the stencil 10 and the flexible leads 24, and thereby prevents diffusion of the uncured silicone elastomer 32 onto the leads 24. The silicone elastomer 32 is cured in situ with the stencil 10 remaining in place on the dielectric element 22 to provide a compliant element 32 for a semiconductor chip package. Referring to FIG. 1E, in certain embodiments, small swatches of thermoplastic or B-staged adhesive 34 may be applied to a liner 36. The swatches of adhesive 34 correspond to the location of the compliant element 32 in the stencil 10 so that the adhesive 34 overlies the compliant element 32. Preferably, the adhesive 34 is abutted against the compliant element 32 before the compliant element 32 is fully cured, as it is well known that the adhesive 34 will more completely adhere to the compliant element 32 if the compliant element is cured while the adhesive 34 is in contact therewith. The adhesive 34 may also comprise what is commonly referred to as a "snap-cure" adhesive. One suitable solvent-free "snap-cure" adhesive is sold under the trade name ABLEBOND 967-3, by the Ablestick Electronic Materials Adhesives Company of Rancho Dominguez, California. Referring to FIG. 1F, a spacer plate 37 having a plurality of apertures 38 therein may be provided over the stencil 10. The apertures in the spacer plate 37 are aligned over the apertures in the stencil 10. The adhesive 34 is disposed within the apertures 38 in the spacer plate 37 so that the adhesive 34 is aligned over the compliant element 32. The stencil 10 and the spacer plate 37 may be comprised of stainless steel.

A connection component assembled in accordance with the processes described above may be stored and/or shipped in the stage shown in FIG. 1F. This particular embodiment shows a connection component wherein the compliant element 32 comprises one or more compliant pads. The stencil 10 and the spacer plate 37 are left in place during storage to protect the assembly. In this particular embodiment, the fugitive material 18 physically isolates the flexible leads 24 from the compliant element 32 to protect the flexible leads 24 from components present in the compliant element 32, such as silicone.

Figure 1G:
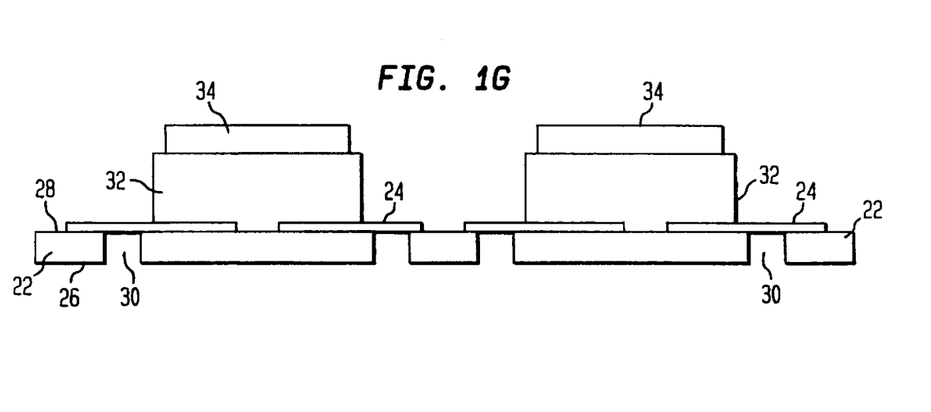
Figure 2:
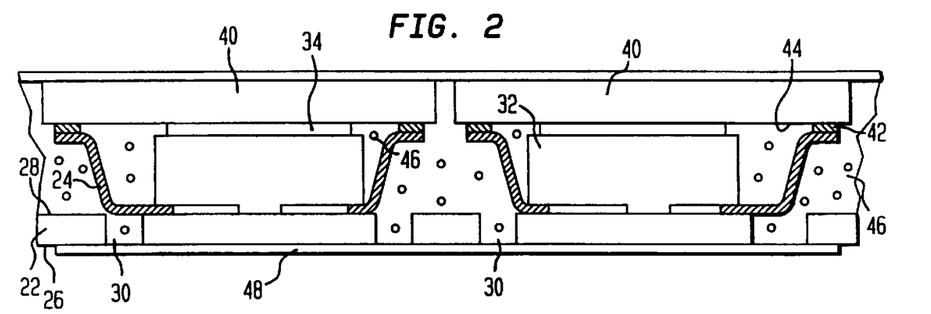
FIG. 2 shows the connection component of FIG. 1G in a further stage of an assembly process according to one embodiment of the invention.

Referring to FIG. 1G and FIG. 2, prior to assembling the connection component with a semiconductor chip 40, the release liner 36, the spacer plate 37 and the stencil 10 are removed from the connection component. The fugitive material 18 is then removed by dissolving the fugitive material 18 from around the leads 24 using water or another liquid solvent so that the flexible leads 24 may be moved into engagement with contacts 42 on the semiconductor chip 40. Preferably, the removal of the fugitive material 18 occurs shortly before the dielectric element 22 is united with the semiconductor chip 40. Typically, the fugitive material 18 is removed less than 24 hours before the electrically connecting step and most preferably less than one hour before the connecting step. The dielectric element 22 is then assembled with the semiconductor chip 40 so that the adhesive 34 on the compliant element 32 is in contact with the front face 44 of the semiconductor chip 40. While the adhesive 34 is held in contact with the front face 44 of the semiconductor chip 40, the adhesive 34 is cured to bond the adhesive 34 to the semiconductor chip 40, which in turn adheres the connection component to the semiconductor chip.

After the connection component has been assembled to the semiconductor chip, each conductive terminal (not shown) on the dielectric element 22 may be connected with an associated contact 42 on the semiconductor chip 40 by electrically connecting the leads 24 to the respective contacts 42. The leads 24 are electrically connected to the contacts 42 on the chip 40 by a conventional wire bonding operation, or by a bonding operation as shown in U.S. Pat. Nos. 5,398,863; 5,390,844; 5,536,909 and 5,491,302. The terminals and leads 24 may be formed from substantially any electrically conductive materials but preferably are formed from metallic materials such as copper and copper alloys, or noble metals and noble metal alloys and are typically fabricated by conventional photolithographic end etching or deposition techniques.

In the next stage of the process, a low elastic modulus dielectric encapsulant 46 or compliant filler, such as a liquid silicone rubber or other curable liquid elastomer, is allowed to flow between the dielectric element 22 and the semiconductor chip 40 and around the compliant element 32 and the flexible leads 24 while the semiconductor chip 40 and the dielectric element 22 are compressed together or held in place. Preferred encapsulation processes are disclosed in commonly assigned U.S. patent application Ser. No. 08/726, 697 filed Oct. 7, 1996, the disclosure of which is incorporated herein by reference. In accordance with the '697 application, a mask/coverlay 48 may be placed over the bond windows 30 to prevent the encapsulant 46 from flowing through the bond windows 30 when the encapsulant 46 is introduced between the chip 40 and the dielectric element 22. The encapsulant 46 is then deposited around at least a portion of the periphery of the semiconductor chip 40 to encapsulate the bonded leads 24. The encapsulant is introduced from the backside of the chip, i.e. the side opposite the front face 44 of the chip 40. The encapsulant 46 may be dispensed so that the level of the encapsulant 46 is just below the plane of the back side of the chip 40; however, preferably, the encapsulant 46 covers the package elements without becoming planar with the back side of the chip 40, i.e. the surface tension of the encapsulant creates a somewhat parabolic cured encapsulant side wall which extends from the side of the chip 46 to the second surface of the dielectric film 22. The encapsulant 46 is then cured by energy such as heat, ultraviolet light or other radiant energy to form a substantially uniform, planar, compliant interface between the chip 40 and a support structure, such as a printed circuit board. Because the encapsulant 46, comprising liquid silicone, is applied after the leads 24 are bonded to the contacts 42, there is no risk of the liquid silicone coming in contact with the flexible leads 24 or contacts 42 before bonding, an occurrence which could, as discussed previously, diminish the strength of the bond between the flexible leads 24 and the contacts 42.

Figure 3A:
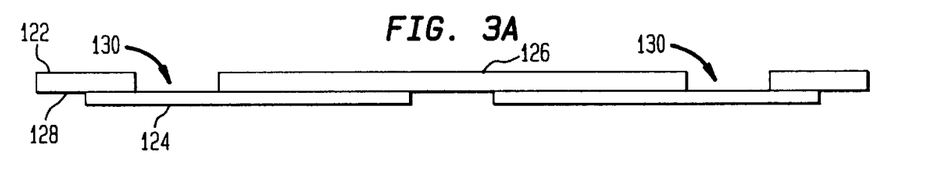
FIG. 3A shows a diagrammatical sectional view of a first stage of a method of assembling a connection component for a semiconductor chip in accordance with a further embodiment of the present invention.
Figure 3B:
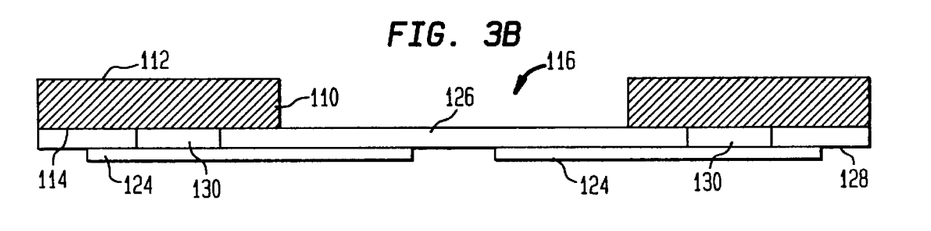
FIGS. 3B–3G show further stages of a method of assembling the connection component of FIG. 3A.
Figure 3C:
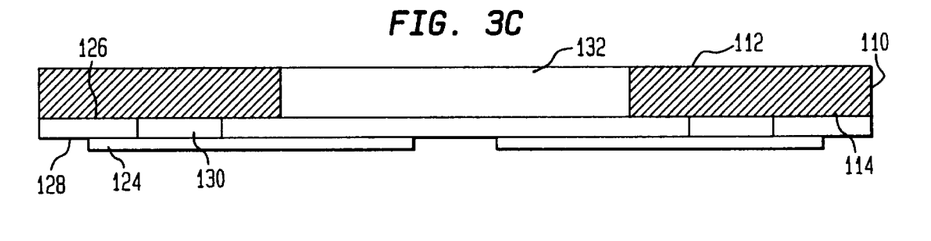
Figure 3D:
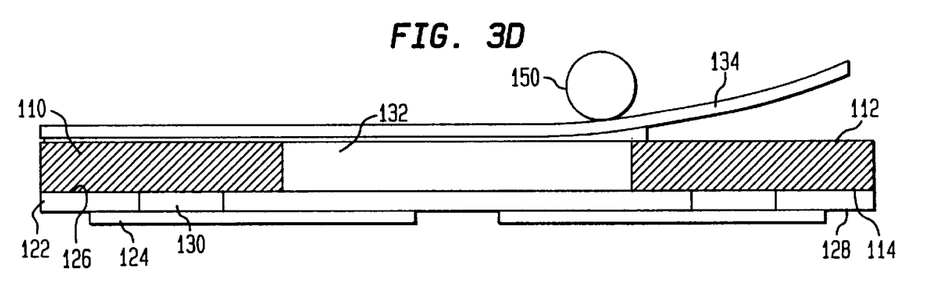
Figure 3E:
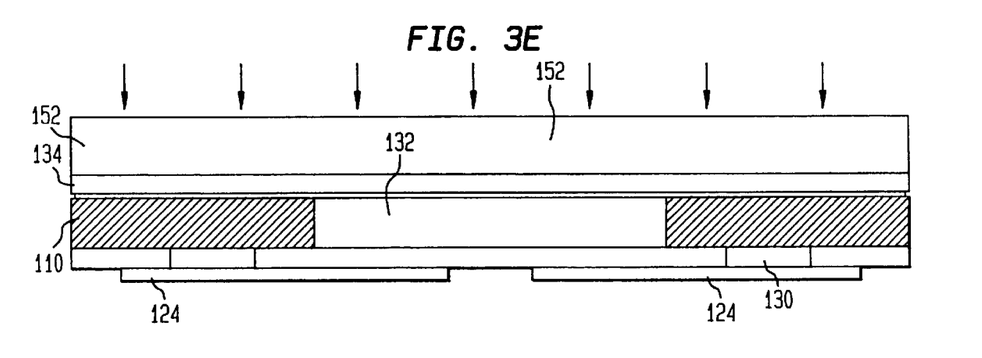
Figure 3F:
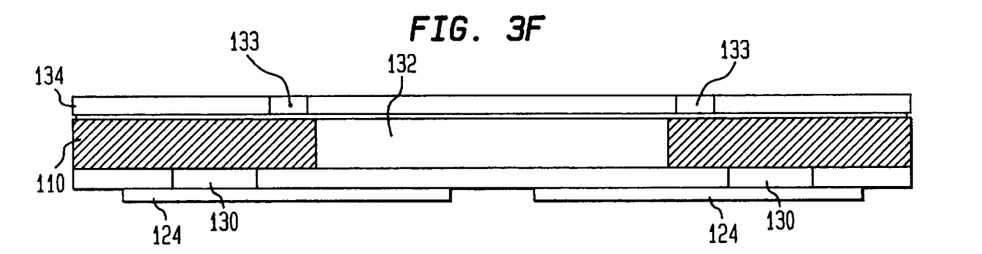

FIGS. 3A–3G show another preferred embodiment of the present invention whereby the stencil used to shape the compliant element comprises a fugitive material. In this particular embodiment, the connection component includes a flexible dielectric element 122 having a first surface 126 and a second surface 128 and including flexible leads 124 on the second surface 128 and bond windows 130. A stencil 110 having a first surface 112 and a second surface 114 is provided on the first surface 126 of the dielectric element 122. The stencil 110 has an aperture 116 in the center thereof; however, it is contemplated that the stencil 110 may include a plurality of apertures. The stencil 110 is formed of the fugitive material, pre-punched with the aperture 116 therein and pre-deposited at the second surface 114 with a water soluble adhesive. The stencil 110 is then assembled to the first surface 126 of the flexible dielectric element 122 as shown in FIG. 3B. Next, a curable material 132, such as a silicone elastomer, is provided on the first surface 112 of the stencil 110 and screen-printed onto the first surface 126 of the dielectric element 122 and into the aperture 116 in the stencil 110. Referring to FIG. 3D, an adhesive 134 is rolled onto a top surface of the curable material 132 and the first surface 112 of the stencil 110. The adhesive 134 may be a thermoplastic film or a partially cured adhesive film. The adhesive 134 is rolled using a roller 150, whereby air pockets or voids are eliminated between the adhesive 134 and the curable elastomer 132. Referring to FIG. 3E, a flat plate 152 is provided and abutted against the top surface of the adhesive 134. The dielectric element 122 and the flat plate 152 are then compressed together so that the curable material 132 and the adhesive 134 are compressed between the flat plate 152 and the dielectric element 122. The assembly is then cured while the dielectric element 122 and the flat plate 152 are compressed together. This particular step ensures that the compliant element 132 is consistent and uniform in its dimensional properties, especially ensuring that the top surface of the compliant element 132 is flat and parallel to the dielectric element 122. Referring to FIG. 3F, a laser or mechanical cutting/punching system (not shown) is then employed to make a controlled depth cut 133 through the adhesive 134 and into the stencil 110, outside the perimeter of the compliant element 132. A storage liner (not shown) may be provided over the adhesive 134 while the connection component is in storage to prevent contamination of the adhesive 134 and the connection component. As shown in FIG. 3F, the stencil 110 and the soluble adhesive adhering the stencil 110 to the first surface 126 of the dielectric element 122 isolate the flexible leads 124 from the compliant element 132. This prevents the silicone present in the compliant element 132 from spreading onto the flexible leads 124, thereby avoiding the problems discussed above. The connection component is stored in a state shown in FIG. 2F and the stencil 110 comprising fugitive material is not removed from the connection component until immediately prior to assembling the connection component with a semiconductor chip. This further reduces the likelihood of silicone diffusion onto the leads 124 which could impede the formation of strong bonds between the flexible leads 124 and contacts on a semiconductor chip.

Figure 3G:
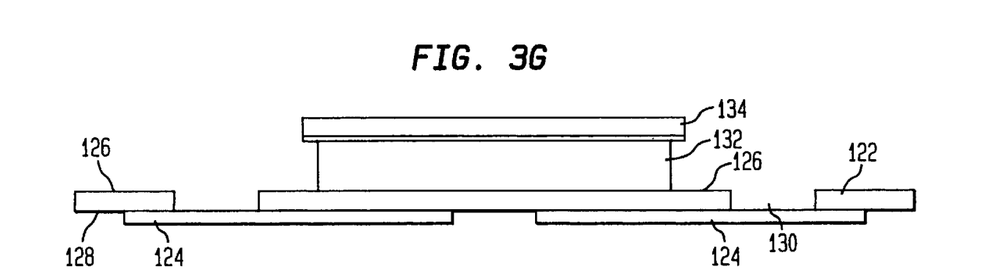

Referring to FIG. 3G, shortly before the connection component is assembled with a semiconductor chip, the stencil 110 is dissolved (or otherwise removed) using a solution according to the processes described above. Once the stencil 110 has been dissolved, the dielectric element 122 is assembled to a semiconductor chip and the flexible leads 124 are bonded to contacts on the semiconductor chip, as described above in reference to FIG. 2. The semiconductor chip assembly may then be encapsulated with a curable liquid as described above so as to protect the leads 124 and provide a homogenous compliant interface for the semiconductor chip.

Figure 4A:
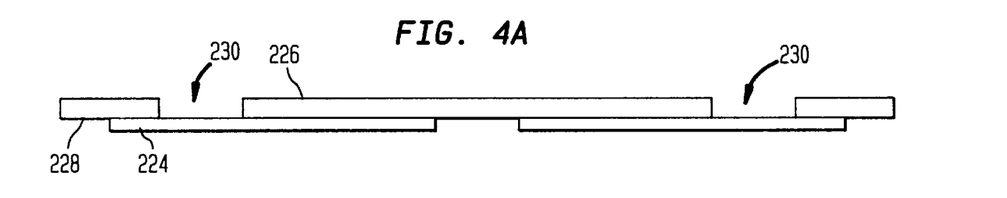
FIGS. 4A–4C show diagrammatical sectional views of a method of assembling a connection component for a semiconductor chip in accordance with yet another embodiment of the present invention.
Figure 4B:
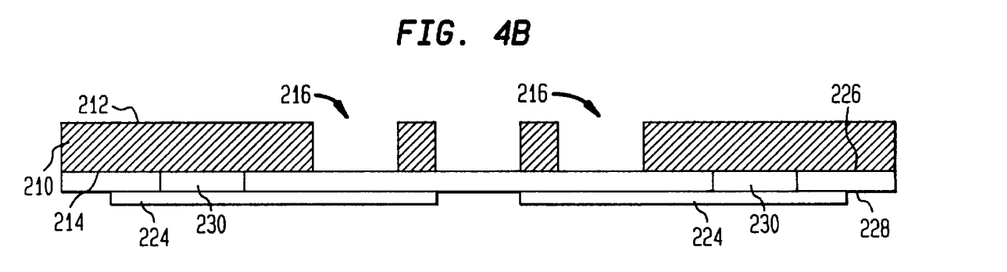
Figure 4C:
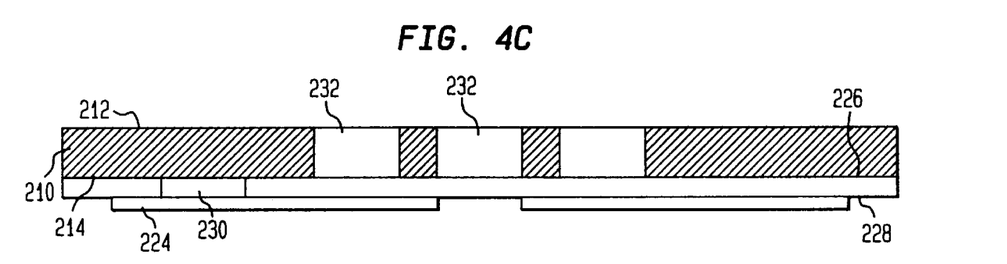

FIGS. 4A–4C show yet another embodiment of the present invention. In this particular embodiment, the compliant element is formed in accordance with processes described in the '699 application, the disclosure of which is incorporated herein by reference. In this embodiment, the connection component comprises a dielectric element 222 having a first surface 226 and a second surface 228, flexible leads 224 on the second surface 228 for connecting the dielectric element 222 to another microelectronic element and bond windows 230 for accessing the leads 224 so that the leads 224 may be bonded to another microelectronic element. The stencil 210 comprises a fugitive material as described above in reference to FIG. 3B. The stencil 210 has a first surface 212 and a second surface 214 and one or more apertures 216 extending therethrough. The second surface 214 of the stencil 210 is placed atop the first surface 226 of the dielectric element 222 and a mass of a curable elastomer, substantially similar to that described above, is wiped or screened across the first surface 212 of the stencil 210 so that the curable elastomer is deposited into the one or more apertures 216. The curable elastomer is then cured to provide a plurality of compliant pads. The stencil 210, comprising a fugitive material, isolates the flexible leads 224 from the compliant pads 232 during assembly and storage of the connection component. The subassembly shown in FIG. 4C may then be completed using the processes shown in FIGS. 1A–1G or FIGS. 3A–3G. In other embodiments the stencil 210 may not comprise a fugitive material; however, in these embodiments, the fugitive material is provided on the bottom surface of the stencil 210. The stencil 210 is then placed over a dielectric substrate including electrically conductive parts so that the fugitive material is in contact with the electrically conductive parts. The curable material is then screen printed into the apertures and, after the curing step, the fugitive material isolates the electrically conductive parts from the compliant element.

As will be readily appreciated, numerous variations and combinations of the features discussed above can be utilized. For example, in the processes described above, the compliant element and the flexible leads may be disposed on the same surface of the dielectric element or may be disposed on opposite sides of the dielectric element. It is also contemplated that the compliant element may comprise materials other than elastomers, such as gels. Further the present invention contemplates that the fugitive material may be applied in configurations other than the configurations described above. For example, the fugitive material may be applied as a coating on the electrically conductive parts using, inter alia, processes similar to ink jet printing technology. The fugitive material may also be a pre-punched and/or pre-formed element which is provided to protect the electrically conductive parts during the final assembly process. Other microelectronic elements such as bond pads may also be protected by the fugitive material. As these and numerous other variations and combinations of the features discussed above may be employed without departing from the present invention, the foregoing description of the preferred embodiment should be taken by way of illustration, rather than by way of limitation, of the features discussed above.

What is claimed is:

1. The method of making a microelectronic assembly comprising the steps of:
   (a) providing a connection component including a dielectric element having electrically conductive parts having first ends;
   (b) providing a fugitive material over the first ends and in contact with said dielectric element;
   (c) providing a curable material on said dielectric element after providing said fugitive material and curing said curable material to provide a compliant element, wherein said fugitive material isolates the first ends of the electrically conductive parts from said compliant element.

2. The method as claimed in claim 1, further comprising the steps of:
   storing said connection component with said fugitive material and said compliant element;
   after the storing step, removing said fugitive material from said connection component;
   after the removing step, connecting said electrically conductive parts to a microelectronic element.

3. The method as claimed in claim 2, wherein the removing step is performed less than 24 hours prior to the connecting step.

4. The method as claimed in claim 3, wherein the removing step is performed less than one hour prior to the connecting step.

5. The method as claimed in claim 3 wherein said fugitive material includes a water soluble material.

6. The method as claimed in claim 5, wherein said fugitive material includes a water-soluble adhesive.

7. The method as claimed in claim 2 wherein the step of removing said fugitive material includes the step of chemically treating said fugitive material.

8. The method as claimed in claim 2, wherein the removing step includes the step of heating said fugitive material.

9. The method as claimed in claim 2, wherein the removing step includes the step of exposing said fugitive material to radiant energy.

10. The method as claimed in claim 2, wherein the removing step includes the step of exposing said fugitive material to ultraviolet energy.

11. The method as claimed in claim 2, further comprising the step of providing a storage liner over said curable material before the curing said curable material step.

12. The method as claimed in claim 2, further comprising the step of providing an adhesive over said compliant layer before the providing a storage liner step, said adhesive being remote from said dielectric element.

13. The method as claimed in claim 12, wherein said adhesive includes a thermoplastic film.

14. The method as claimed in claim 12, wherein the step of providing an adhesive in contact with said curable material step includes the step of:
   (a) providing a spacer plate having one or more apertures therein over the first surface of said stencil so that the one or more apertures in said spacer plate are in substantial alignment with said curable material;
   (b) providing said adhesive in the one or more apertures in said spacer plate, whereby said adhesive is in contact with said curable material.

15. The method as claimed in claim 12, wherein the step of providing an adhesive includes providing a curable elastomer material which is partially cured.

16. The method as claimed in claim 2, wherein said compliant element includes an array of compliant pads defining channels therein.

17. The method as claimed in claim 16, further comprising the steps of:
  allowing a curable liquid to flow within said channels and around said electrically conductive parts after the connecting step;
  curing said curable liquid.

18. The method as claimed in claim 17, wherein said curable liquid includes a silicone elastomer.

19. The method as claimed in claim 2, further comprising the step of abutting said microelectronic element against said compliant layer after the removing step and before the connecting step.

20. The method as claimed in claim 19, wherein said microelectronic element includes a semiconductor chip having electrical contacts thereon, the connecting step including the step of bonding the electrically conductive parts of said dielectric element and the contacts of said chip together.

21. The method as claimed in claim 1, wherein the providing said fugitive material in contact with said dielectric element step includes the steps of:
  (a) providing a stencil having a first surface and a second surface and one or more apertures extending therethrough;
  (b) printing or depositing said fugitive material on the second surface of said stencil, around said one or more apertures thereof;
  (c) abutting the second surface of said stencil against said dielectric element so that said fugitive material is in contact with said dielectric element;
  (d) curing said fugitive material.

22. The method as claimed in claim 21, wherein the step of providing said curable material on said dielectric element step includes the step of stenciling said curable material over said first surface and into said one or more apertures in said stencil after the abutting the second surface of said stencil step, and curing said curable material.

23. The method as claimed in claim 22, wherein said stencil remains on said dielectric element during the curing said curable material step.

24. The method as claimed in claim 2, wherein said curable material includes an adhesive.

25. The method as claimed in claim 2, wherein the step of providing said fugitive material includes the step of providing a stencil having a first surface and a second surface and including one or more apertures extending therethrough.

26. The method as claimed in claim 25, wherein the step of providing said curable material on said dielectric element includes the steps of disposing said curable material in said one or more apertures in said stencil and curing said curable material while said stencil remains on said dielectric element.

27. The method as claimed in claim 26, further comprising the steps of:
  before the curing said curable material step, providing an adhesive in contact with said curable material and remote from said dielectric element;
  providing a substantially flat plate and compressing said adhesive and said curable material between said dielectric element and said plate during the curing said curable material step.

28. The method of making a microelectronic assembly comprising the steps of:
  (a) providing a connection component including a dielectric element having electrically conductive parts;
  (b) providing a fugitive material in contact with said dielectric element;
  (c) providing a curable material on said dielectric element after providing said fugitive material and curing said curable material to provide a compliant element, wherein said fugitive material isolates the electrically conductive parts from said compliant element;
  (d) storing said connection component with said fugitive material and said compliant element;
  (e) after the storing step, removing said fugitive material from said connection component;
  (f) after the removing step, connecting said electrically conductive parts to a microelectronic element;
  (g) wherein the step of providing said fugitive material includes the step of providing a stencil having a first surface and a second surface and including one or more apertures extending therethrough;
  (h) wherein the step of providing said curable material on said dielectric element includes the steps of disposing said curable material in said one or more apertures in said stencil and curing said curable material while said stencil remains on said dielectric element;
  (i) before the curing said curable material step, providing an adhesive in contact with said curable material and remote from said dielectric element;
  (j) providing a substantially flat plate and compressing said adhesive and said curable material between said dielectric element and said plate during the curing said curable material step;
  (k) after the curing step, cutting through said adhesive and into said fugitive material outside the perimeter of said compliant element.

* * * * *

UNITED STATES PATENT AND TRADEMARK OFFICE
CERTIFICATE OF CORRECTION

PATENT NO. : 6,266,872 B1  
DATED : July 31, 2001  
INVENTOR(S) : Joseph Fjelstad Page 1 of 1

It is certified that error appears in the above-identified patent and that said Letters Patent is hereby corrected as shown below:

Column 6,
Line 34, "differ-use" should read -- diffuse --

Column 12,
Line 2, "1. The method" should read -- 1. A method --

Column 14,
Line 27, "(f) after tho" should read -- (f) after the --

Signed and Sealed this

Twelfth Day of March, 2002

Attest:

Attesting Officer

JAMES E. ROGAN
*Director of the United States Patent and Trademark Office*